United States Patent
Huang et al.

(10) Patent No.: US 11,276,638 B2
(45) Date of Patent: Mar. 15, 2022

(54) BACK END OF LINE VIA TO METAL LINE MARGIN IMPROVEMENT

(71) Applicants: TAIWAN SEMICONDUCTOR MANUFACTURING COMPANY LTD., Hsinchu (TW); TSMC NANJING COMPANY, LIMITED, Nanjing (CN)

(72) Inventors: Yi-Chun Huang, Miaoli County (TW); I-Chih Chen, Tainan (TW); Chun-Wei Kuo, Tainan (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 60 days.

(21) Appl. No.: 16/676,819

(22) Filed: Nov. 7, 2019

(65) Prior Publication Data

US 2020/0411431 A1  Dec. 31, 2020

(30) Foreign Application Priority Data

Jun. 28, 2019  (CN) .......................... 201910576756.3

(51) Int. Cl.
*H01L 23/52* (2006.01)
*H01L 23/522* (2006.01)
(Continued)

(52) U.S. Cl.
CPC .... *H01L 23/5226* (2013.01); *H01L 21/76807* (2013.01); *H01L 21/76816* (2013.01); *H01L 21/76834* (2013.01); *H01L 23/5283* (2013.01)

(58) Field of Classification Search
CPC ........... H01L 23/5226; H01L 21/76807; H01L 21/76816; H01L 21/76834; H01L 21/5283
See application file for complete search history.

(56) References Cited

U.S. PATENT DOCUMENTS

2009/0321940 A1* 12/2009 Kunkel ............ H01L 23/53295
257/758
2012/0032333 A1  2/2012 Harada et al.
(Continued)

FOREIGN PATENT DOCUMENTS

JP        H0864680     3/1996
JP        H08139194    5/1996
(Continued)

OTHER PUBLICATIONS

Office Action dated Mar. 19, 2021 for corresponding case No. TW 11020253400. (pp. 1-8).
(Continued)

*Primary Examiner* — Victor A Mandala
*Assistant Examiner* — Colleen E Snow
(74) *Attorney, Agent, or Firm* — Hauptman Ham, LLP

(57) ABSTRACT

A semiconductor structure includes a first conductive line and a second conductive line in a first dielectric layer, and a third conductive line in a second dielectric layer overlying the first dielectric layer. The first conductive line and the second conductive line each extend along a first direction. The third conductive line extends along a second direction different from the first direction and above at least the second conductive line. The semiconductor structure further includes a via in the second dielectric layer and electrically connecting the second conductive line and the third conductive line. The via lands on a portion of the second conductive line. The semiconductor structure further includes a dielectric cap over the first conductive line. A bottom surface of the dielectric cap is below a top surface of the first dielectric layer.

20 Claims, 16 Drawing Sheets

(51) Int. Cl.
*H01L 21/768* (2006.01)
*H01L 23/528* (2006.01)

(56) References Cited

U.S. PATENT DOCUMENTS

2014/0264902 A1    9/2014   Ting et al.
2014/0342549 A1*  11/2014   Holmes ............ H01L 21/76883
                                                        438/634
2018/0315653 A1   11/2018   Briggs et al.

FOREIGN PATENT DOCUMENTS

| KR | 20130127013 | 11/2013 |
| KR | 20140111913 | 9/2014 |
| KR | 20150034191 | 4/2015 |
| KR | 20170095827 | 8/2017 |
| KR | 20170099853 | 9/2017 |
| KR | 20190013413 | 2/2019 |
| KR | 20190064428 | 6/2019 |
| TW | 201806081 | 2/2018 |
| TW | I643292 | 12/2018 |
| TW | 201909369 | 3/2019 |
| TW | 201911467 | 3/2019 |
| TW | 201911482 | 3/2019 |
| TW | 201916248 | 4/2019 |
| WO | 2014046856 | 3/2014 |
| WO | 2016105350 | 6/2016 |

OTHER PUBLICATIONS

Office Action dated Jan. 22, 2021 for corresponding case No. KR 10-2020-0013637. (pp. 1-8).
Office Action dated Jul. 22, 2021 for corresponding case No. KR 10-2020-0013637. (pp. 1-6) English translation attached on p. 1.
Office Action dated Jan. 19, 2022 for corresponding case No. TW 11120066300. (pp. 1-4).

\* cited by examiner

BACK END OF LINE VIA TO METAL LINE MARGIN IMPROVEMENT

PRIORITY CLAIM

This application claims the priority of CN Application No. 20190576756.3, filed Jun. 28, 2019, which is incorporated herein by reference in its entirety.

BACKGROUND

Integrated circuits contain numerous devices such as transistors, diodes, capacitors and resistors that are fabricated on and/or in a semiconductor substrate. These devices are initially isolated from one another and are later interconnected together to form functional circuits in the back end of line (BEOL) processing stage. As features in integrated circuits continue to shrink, the impact of the interconnect structures on the performance and reliability of the integrated circuits increases.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions and spatial relationship(s) of the various features may be arbitrarily enlarged or reduced for clarity. Like reference numerals denote like features throughout specification and drawings.

DETAILED DESCRIPTION

Figure 1A:
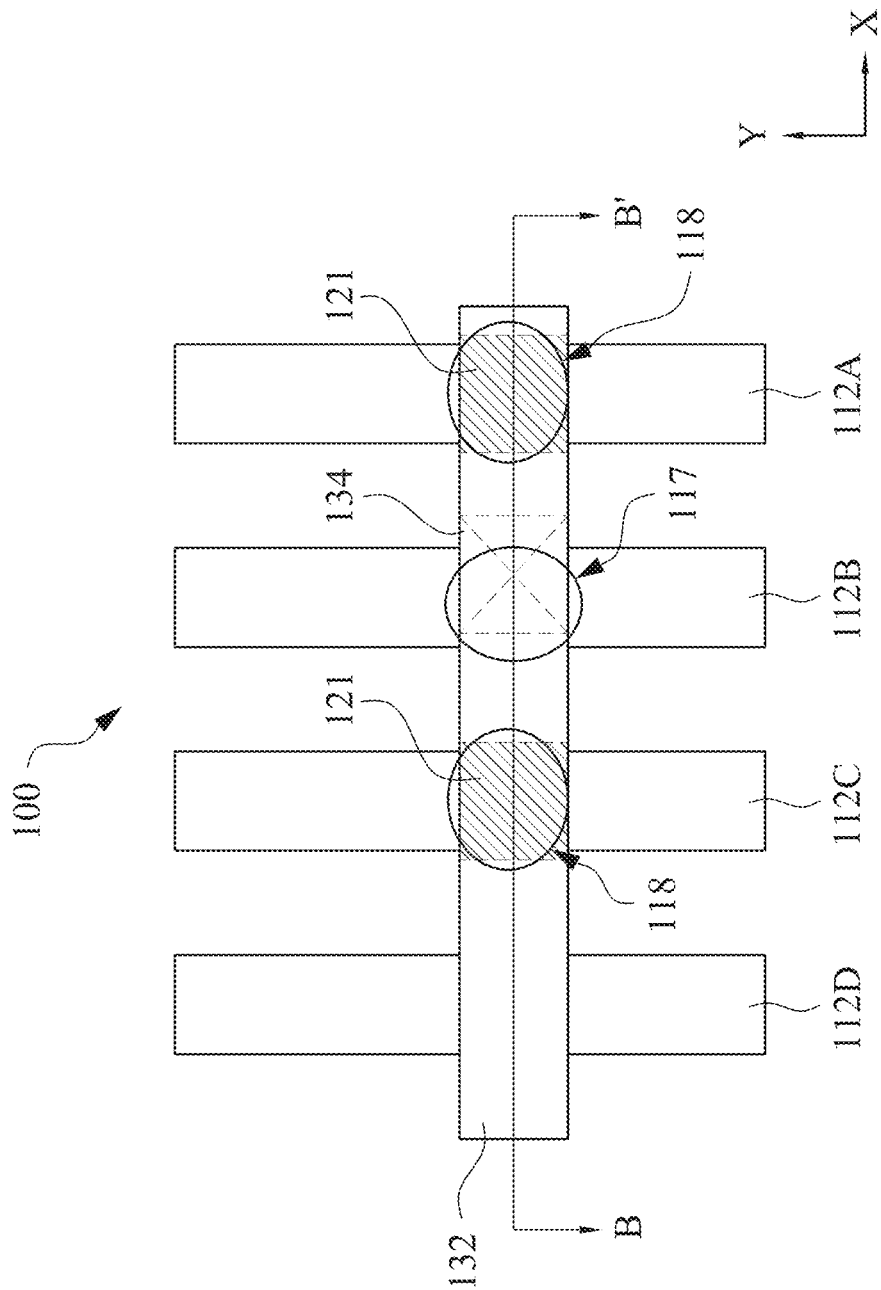
FIG. 1A is a top view of a semiconductor structure, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a multilayer interconnect structure, metal lines (e.g., copper lines) are laid in stacked dielectric layers and are connected through vias from one layer to another layer. Metal lines and vias are fabricated using single or dual damascene processes in some instances. In such processes, after formation of lower level metal lines in a dielectric layer, another dielectric layer is formed over the dielectric layer and is patterned to form trenches and via openings. The trenches and the via openings are then filled with a conductive metal to form upper level metal lines and vias, respectively. The multiple dielectric layers are patterned using lithography processes. Ideally, the vias are formed to fully align with corresponding lower level metal lines in an underlying dielectric layer through alignment of lithography masks. However, some level of mask misalignment unavoidably occurs in lithography processes, and the overlay errors often result in misalignment of vias with respect to the target metal lines. A misaligned via sometimes causes shorting of the via with a neighboring metal line, thereby creating defects and reducing the reliability of integrated circuits. As the semiconductor technologies move toward advanced technology nodes with smaller feature sizes, the spacing between adjacent metal lines has decreased rapidly. The via misalignment thus becomes more impactful to the performance and reliability of integrated circuits.

The present disclosure provides structures and methods for improving via to metal line margin in the back-end-of-line (BEOL) processing. In some embodiments, a portion of each lower level conductive line on either side of a target lower level conductive line that is adjacent to the misaligned via is recessed and a dielectric cap is formed over each recessed portion of the neighboring lower level conductive lines. The dielectric caps help to increase the via to conductive line margin, and thus help to prevent shorting of the via with the neighboring lower level conductive lines. The dielectric caps also help to reduce parasitic capacitance of conductive lines. As a result, the operation efficiency of integrated circuit is improved.

Figure 1B:
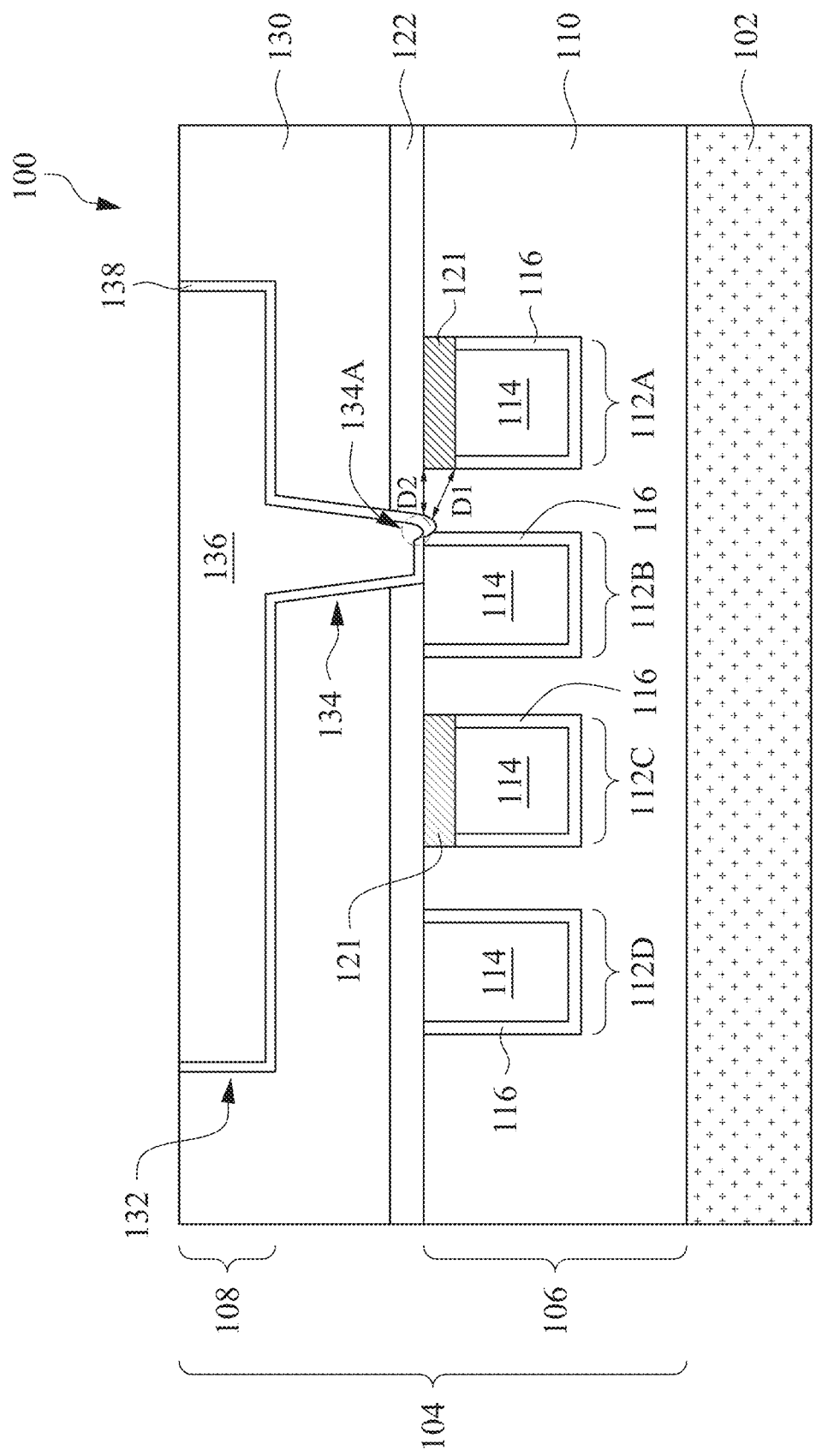
FIG. 1B is a cross-sectional view of the semiconductor structure of FIG. 1A along the line B-B'.

FIG. 1A is a top view of a semiconductor structure 100, in accordance with some embodiments of the present disclosure. FIG. 1B is a cross-sectional view of the semiconductor structure 100 of FIG. 1A along the line B-B'. Referring to FIGS. 1A and 1B, the semiconductor structure 100 includes a substrate 102 and a multilayer interconnect structure 104, in accordance with embodiments of the present disclosure. The interconnect structure 104 is over the substrate 102 and connects the various active and/or passive devices in the substrate 102 to form an integrated circuit. For the purpose of simplicity, the interconnect structure 104 includes two metallization layers, e.g., a first metallization layer 106 overlying the substrate 102 and a second metallization layer 108 immediately above the first metallization layer 106. One of ordinary skill in the art would understand that, in some instances, the interconnect structure 104 includes more than two metallization layers, such as five, seven, or even more metallization layers in complex integrated circuits. In addition, although FIG. 1B includes the first metallization layer 106 directly above and contacting the substrate 102, in some instances, the interconnect structure 104 includes one or more metallization layers disposed between the first metallization layer 106 and the substrate 102 or above the second metallization layer 108. The first metallization layer 106 thus is an Mx level metallization layer, and the second metallization layer 108 is an M(x+1) level metallization layer.

The first metallization layer 106 includes a first dielectric layer 110 and a plurality of lower level conductive lines embedded in the first dielectric layer 110. For the purpose of simplicity, the first metallization layer 106 includes four conductive lines, e.g., a first lower level conductive line 112A, a second lower level conductive line 112B, a third lower level conductive line 112C (FIG. 1A), and a fourth lower level conductive line 112D (FIG. 1A) in the first dielectric layer 110. The second metallization layer 108 includes a second dielectric layer 130 and a plurality of upper level conductive lines embedded in the second dielectric layer 130. For the purpose of simplicity, the second metallization layer 108 includes a single conductive line, e.g., an upper level conductive line 132 in the second dielectric layer 130. In some embodiments, the second dielectric layer 130 is separated from the first dielectric layer 110 by an etch stop layer 122. In some embodiments, the lower level conductive lines 112A, 112B, 112C and 112D each extend (or is oriented) in a Y-direction. The upper level conductive line 132 extends in an X-direction. In some embodiments, the X-direction and the Y-direction are perpendicular to one another. In some embodiments, the X-direction is a horizontal direction and the Y-direction is a vertical direction. In some embodiments, the upper level conductive line 132 overlaps with a portion of each of the lower level conductive lines 112A, 112B, 112C and 112D (FIG. 1A). In some embodiments, the upper level conductive line 132 overlaps with some of the lower level conductive lines 112A, 112B, 112C or 112D. In some embodiments, electrical connection between the first metallization layer 106 and the second metallization layer 108 is made by interconnecting the upper level conductive line 132 and the second lower level conductive line 112B through a via 134. The via 134 extends through a lower portion of the second dielectric layer 130 and the etch stop layer 122, and overlapping a portion of the second lower level conductive line 112B. The second lower level conductive line 112B is also referred to as a target lower level conductive line 112B.

In some embodiments, each of the lower level conductive lines 112A, 112B, 112C and 112D includes a metal portion 114 and a metal liner 116 surrounding the metal portion 114. Similarly, the upper level conductive line 132 and the via 134 include a metal portion 136 and a metal liner 138 surrounding the metal portion 136. Further, a portion of each of the first and third lower level conductive lines 112A and 112C adjacent to the via 134 has a recessed top surface with respect to a top surface of a portion of the second lower level conductive line 112B where the via 134 is landed on. A dielectric cap 121 is over the recessed portion of each of the first and third lower level conductive lines 112A, 112C. The portion of the second lower level conductive line 112B over which the via 134 is landed is herein referred to as a via landing portion 117 (FIG. 1A), while the recessed portion of each of the first and third lower level conductive lines 112A and 112C is herein referred to as a non-via landing portion 118 (FIG. 1A). In some embodiments, the via landing portion 117 is at the intersection of the upper level conductive line 132 and the target lower level conductive line 112B, and the non-via landing portion 118 is at the intersection of the upper level conductive line 132 and a corresponding lower level conductive line 112A or 112C that is adjacent to the target lower level conductive line 112B.

The via 134 and the underlying lower level conductive lines 112A, 112B, 112C and 112D are formed in separate damascene processes, each of which involves lithographically patterning the corresponding first dielectric layer 110 and the second dielectric layer 130. However, during the damascene process for the formation of the via opening for the via 134, in some instances, an overlay error occurs between the via opening and the target lower level conductive line 112B, which results in the misalignment of the via 134 subsequently formed in the via opening with the target lower level conductive line 112B. Due to variations in lithography conditions, the via 134 is misaligned on either side of the target lower level conductive line 112B. For example, the via 134 in FIGS. 1A and 1B is misaligned to the right side of the target lower level conductive line 112B.

The misalignment of the via 134 causes the via 134 to extend beyond the right edge of the target lower level conductive line 112B. The misalignment of the via 134 reduces the lateral distance between the via 134 and a lower level conductive line adjacent to the target lower level conductive line 112B, e.g., the first lower level conductive line 112A. There is a risk that via 134 bridges the target lower level conducive line 112B with the adjacent lower level conductive line 112A, resulting in a short circuit. In some embodiments, the overlay error also causes etching the first dielectric layer 110 during formation of the via opening, as a result, the via 134 is formed to include a portion 134A embedded in the first dielectric layer 110. The portion 134A shortens the distance between the target lower level conductive line 112B and the neighboring lower level conductive line 112A and leads to leakage of current. The leakage current increases over time, causing dielectric breakdown, and eventually failure of the integrated circuit.

By introducing a dielectric cap 121 over a non-via landing portion 118 of each of the neighboring lower level conductive lines 112A and 112 C adjacent to the via landing portion 117 of the target lower level conductive line 112B, when the misalignment of the via 134 occurs, the distance D1 between the via 134 and the non-via landing portion 118 of a corresponding neighboring lower level conductive line, e.g., first lower level conductive line 112A, is greater than the corresponding distance D2 otherwise formed, if the non-via landing portion 118 of the first lower level conductive line 112A is not recessed and the dielectric cap 121 is not formed thereon. Introducing dielectric caps 121 on neighboring lower level conductive lines 112A and 112C thus help to increase the via-to-conductive line margin, which in turn help to prevent short circuits of the target lower level conductive line 112B with the neighboring lower level conductive line 112A or 112C. The dielectric caps 121 also help to eliminate dielectric breakdown failure, which in turn helps to enhance the reliability of the integrated circuit.

Figure 2:
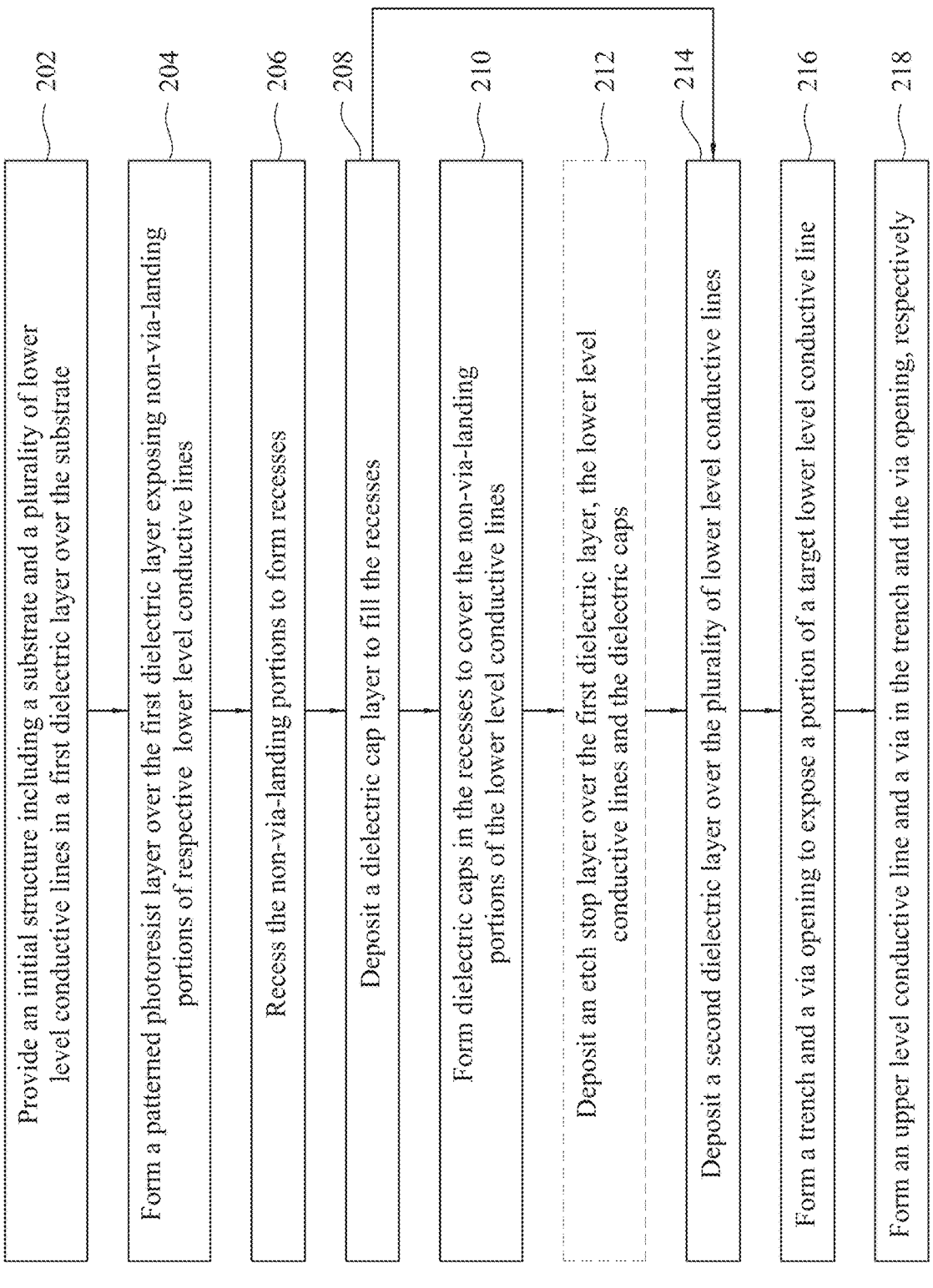
FIG. 2 is a flowchart of a method of fabricating a semiconductor structure, in accordance with some embodiments.

FIG. 2 is a flowchart of a method 200 of fabricating a semiconductor structure, e.g., the semiconductor structure 100 of FIGS. 1A and 1B, in accordance with some embodiments. FIGS. 3 through 11 are cross-sectional views of the semiconductor structure 100 in various stages of a manufacturing process, in accordance with some embodiments. The method 200 is discussed in detail below, with reference to the semiconductor structure 100, in FIGS. 3-11. In some embodiments, additional operations are performed before, during, and/or after the method 200, or some of the operations described are replaced and/or eliminated. In some embodiments, additional features are added to the semiconductor structure 100. In some embodiments, some of the features described below are replaced or eliminated. One of ordinary skill in the art would understand that although some embodiments are discussed with operations performed in a particular order, these operations may be performed in another logical order.

Figure 3:
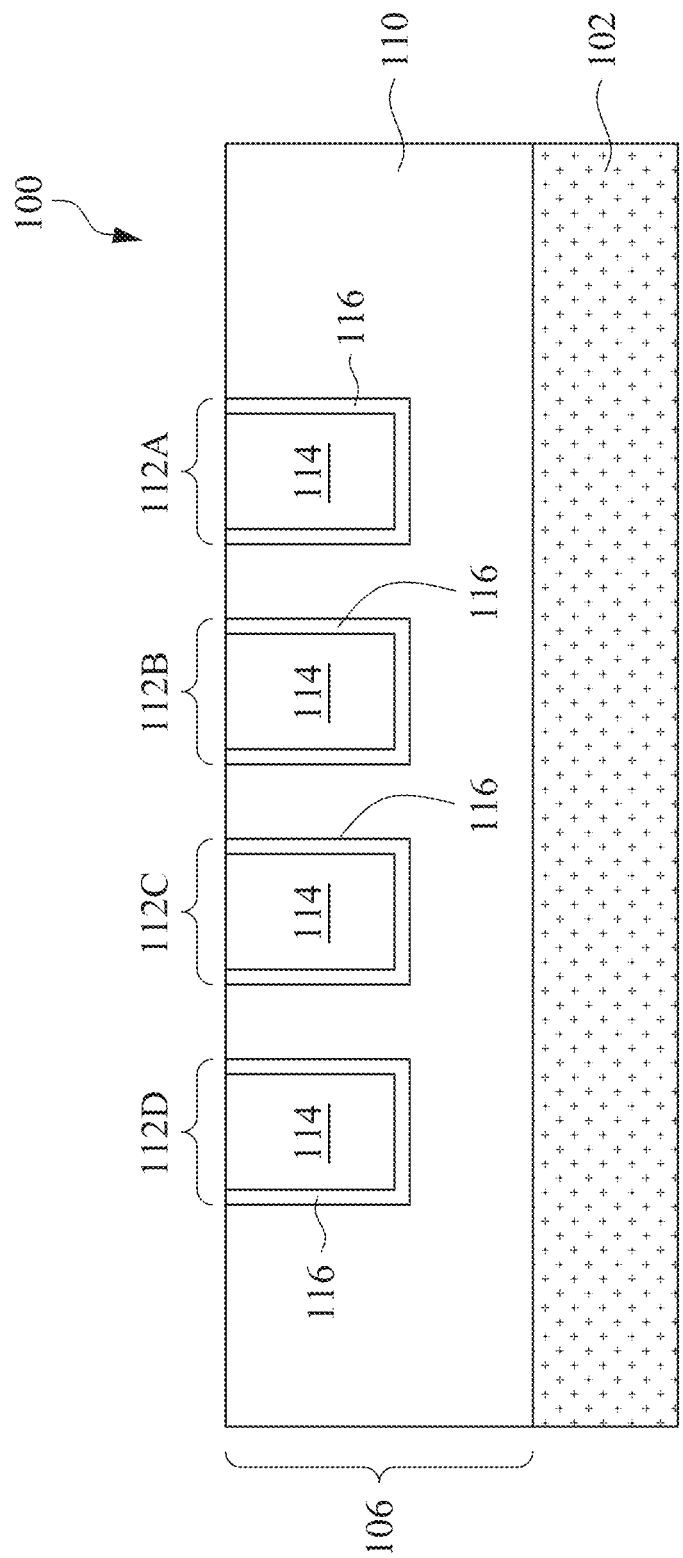
FIG. 3 is a cross-sectional view of an initial structure of a semiconductor structure including a substrate and a plurality of lower level conductive lines in a first dielectric layer over the substrate, in accordance with some embodiments.

Referring to FIGS. 2 and 3, execution of the method 200 comprises performing operation 202, in which an initial structure of a semiconductor structure 100 is provided. In FIG. 3, the initial structure of the semiconductor structure 100 includes a substrate 102. In some embodiments, the substrate 102 is a bulk semiconductor substrate including silicon. Alternatively or additionally, in some embodiments the bulk semiconductor substrate includes another elementary semiconductor such as germanium, a compound semiconductor including gallium arsenide, gallium phosphide, indium phosphide, indium arsenide, and/or indium antimonide, an alloy semiconductor including SiGe, GaAsP, AlInAs, AlGaAs, GaInAs, GaInP, and/or GaInAsP; or combinations thereof. In some embodiments, the substrate 102 includes an epitaxial layer. For example, the substrate 102 has an epitaxial layer overlying a bulk semiconductor substrate. Furthermore, in some embodiments, the substrate 102 is a semiconductor on insulator (SOI) substrate. For example, the substrate 102 includes a buried oxide (BOX) layer formed by a process such as separation by implanted oxygen (SIMOX) or other suitable techniques, such as wafer bonding and grinding.

In some embodiments, the substrate 102 further includes active devices such as p-type field effect transistors (PFET), n-type FET (NFET), metal-oxide semiconductor (MOS) transistors, complementary metal-oxide semiconductor (CMOS) transistors, bipolar transistors, high voltage transistors, and/or high frequency transistors. In some embodiments, the transistors are planar transistors or three-dimensional fin-type transistors. In some embodiments, the substrate 102 further includes passive devices such as resistors, capacitors, and/or inductors. The substrate 102 further includes isolation structures such as shallow trench isolation (STI) structures to separate various active and/or passive devices from one another.

A first metallization layer 106 is formed over the substrate 102. The first metallization layer 106 includes a first dielectric layer 110 and a plurality of lower level conductive lines embedded in the first dielectric layer 110. For the purpose of simplicity, four lower level conductive lines including a first lower level conductive line 112A, a second lower level conductive line 112B, a third lower level conductive line 112C, and a fourth lower level conductive line 112D in FIG. 3. The lower level conductive lines 112A, 112B, 112C and 112D each extend in a Y-direction. In some embodiments, the Y-direction is a vertical direction. The lower level conductive lines 112A, 112B, 112C and 112D are arranged in parallel and are isolated from each other by the first dielectric layer 110. In some embodiments, every adjacent lower level conductive lines 112A, 112B, 112C and 112D is spaced by a minimum metal line spacing allowed by design rules according to a manufacturing process. The minimum spacing between adjacent lower level conductive lines 112A, 112B, 112C, and 112D varies based on the technology node. In some embodiments, the spacing between adjacent lower level conductive lines 112A, 112B, 112C, and 112D is from about 12 nm to about 32 nm. In some embodiments, each of the lower level conductive lines 112A, 112B, 112C and 112D includes a metal portion 114 and a metal liner 116 surrounding the metal portion 114. The metal liner 116 separates the metal portion 114 from the first dielectric layer 110, thereby preventing metal (e.g., copper) in the metal portion 114 from diffusing into the first dielectric layer 110.

In some embodiments, the first dielectric layer 110 includes silicon oxide. In some embodiments, the first dielectric layer 110 includes a low-k dielectric material having a dielectric constant (k) less than 4. In some embodiments, the low-k dielectric material has a dielectric constant from about 1.2 to about 3.5. In some embodiments, the first dielectric layer 110 includes tetraethylorthosilicate (TEOS) oxide, undoped silicate glass, or doped silicate glass such as borophosphosilicate glass (BPSG), fluorosilica glass (FSG), phosphosilicate glass (PSG), boron doped silicon glass (BSG), and/or other suitable dielectric materials. In some embodiments, the first dielectric layer 110 is deposited by chemical vapor deposition (CVD), plasma enhanced chemical vapor deposition (PECVD), physical vapor deposition (PVD), or spin coating. In some embodiments, the first dielectric layer 110 is planarized by a planarization process or otherwise recessed to provide a planar top surface. In some embodiments, the top surface of the first dielectric layer 110 is planarized using a chemical mechanical polishing (CMP) process.

Subsequently, the first dielectric layer 110 is patterned with one or more lithography and etching processes to form trenches (not shown) therein. In some embodiments, the lithography process includes applying a photoresist layer (not shown) over the first dielectric layer 110, exposing the photoresist layer to a pattern, performing post-exposure baking, and developing the resist to form a patterned photoresist layer (not shown). The patterned photoresist layer exposes portions of the first dielectric layer 110 where the trenches are to be formed. Next, the portions of the first dielectric layer 110 that are exposed by the patterned photoresist layer are etched to form the trenches. In some embodiments, the first dielectric layer 110 is etched using a dry etch such as, for example, a reactive ion etch (RIE) or a plasma etch. After formation of trenches in the first dielectric layer 110, the patterned photoresist layer is removed, for example, by wet stripping or plasma ashing. Alternatively, in some embodiments, a hard mask is used such that the trench pattern is transferred from the pattered photoresist layer to the hard mask by a first etch and then transferred to the first dielectric layer 110 by a second etch.

Thereafter, the lower level conductive lines 112A, 112B, 112C and 112D are formed in the trenches. A first metal liner layer (not shown) is first deposited on sidewalls and bottoms of the trenches and on the top surface of the first dielectric layer 110. In some embodiments, the first metal liner layer includes a diffusion barrier material that prevents the metal in the metal portion 114 from diffusing into the first dielectric layer 110. In some embodiments, the first metal liner layer includes titanium (Ti), titanium nitride (TiN), tantalum (Ta), tantalum nitride (TaN), ruthenium (Ru), ruthenium nitride (RuN), or other suitable diffusion barrier materials. In some embodiments, the first metal liner layer includes a stack of the above-mentioned diffusion barrier materials such as, for example, Ti/TiN or Ta/TaN. In some embodiments, the first metal liner layer is deposited utilizing a conformal deposition process such as CVD, PECVD, PVD, or atomic layer deposition (ALD).

Subsequently, a first metal layer (not shown) is deposited over the first metal liner layer to fill the trenches. In some embodiments, the first metal layer includes copper (Cu), aluminum (Al), tungsten (W), cobalt (Co), an alloy thereof, or other suitable conductive metals. In some embodiments, the first metal layer is deposited by a suitable deposition process such as, for example, CVD, PECVD, sputtering, or plating. In some embodiments, especially when Cu or a Cu alloy is employed in the first metal layer, an optional plating seed layer (not shown) is formed on the first metal liner layer prior to the formation of the first metal layer. In some embodiments, the optional plating seed layer is formed by a deposition process including, for example, CVD, PECVD, ALD, and PVD.

Thereafter, portions of the first metal layer and the first metal liner layer that are located above the top surface of the first dielectric layer 110 are removed using a planarization process. In some embodiments, a CMP process is performed to remove excess diffusion barrier material and conductive metal from the top surface of the first dielectric layer 110. A remaining portion of the first metal liner layer on the sidewalls and the bottom of each trench constitutes the metal liner 116, and a remaining portion of the first metal layer within each trench constitutes the metal portion 114. After the CMP process, the lower level conductive lines 112A, 112B, 112C and 112D each have a top surface that is coplanar with each other and with the top surface of the first dielectric layer 110.

Figure 4:
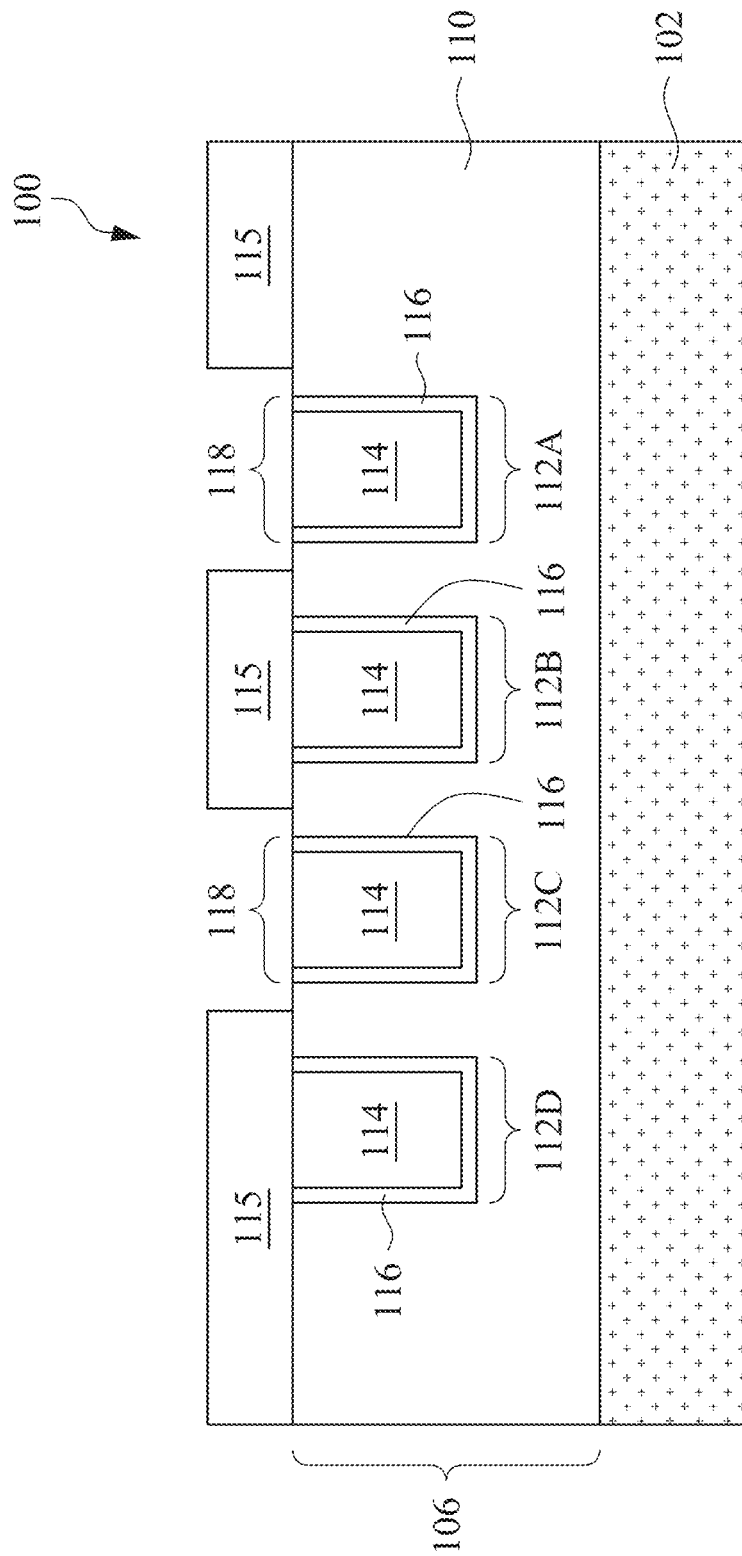
FIG. 4 is a cross-sectional view of the semiconductor structure of FIG. 3 after forming a patterned photoresist layer to expose a non-via landing portion of each of a first lower level conductive line and a third lower level conductive line on opposite sides of a second lower level conductive line, in accordance with some embodiments.

Referring to FIG. 2 and FIG. 4, execution of method 200 comprises performing operation 204 in which a patterned photoresist layer 115 is formed over the first dielectric layer 110. The patterned photoresist layer 115 exposes a non-via landing portion 118 of each of the first lower level conductive line 112A and the third lower level conductive line 112C. As used herein, a non-via landing portion refers to a portion of a lower level conductive line that is adjacent to a portion of a target lower level conductive line where a via is landed. The patterned photoresist layer 115 is formed by a lithography process. For example, a photoresist layer (not shown) is first applied over the first dielectric layer 110 and the lower level conductive lines 112A, 112B, 112C and 112D. The photoresist layer is then patterned by exposing the photoresist to a pattern, performing post-exposure bake processes, and developing the photoresist, thereby forming the patterned photoresist layer 115.

Figure 5:
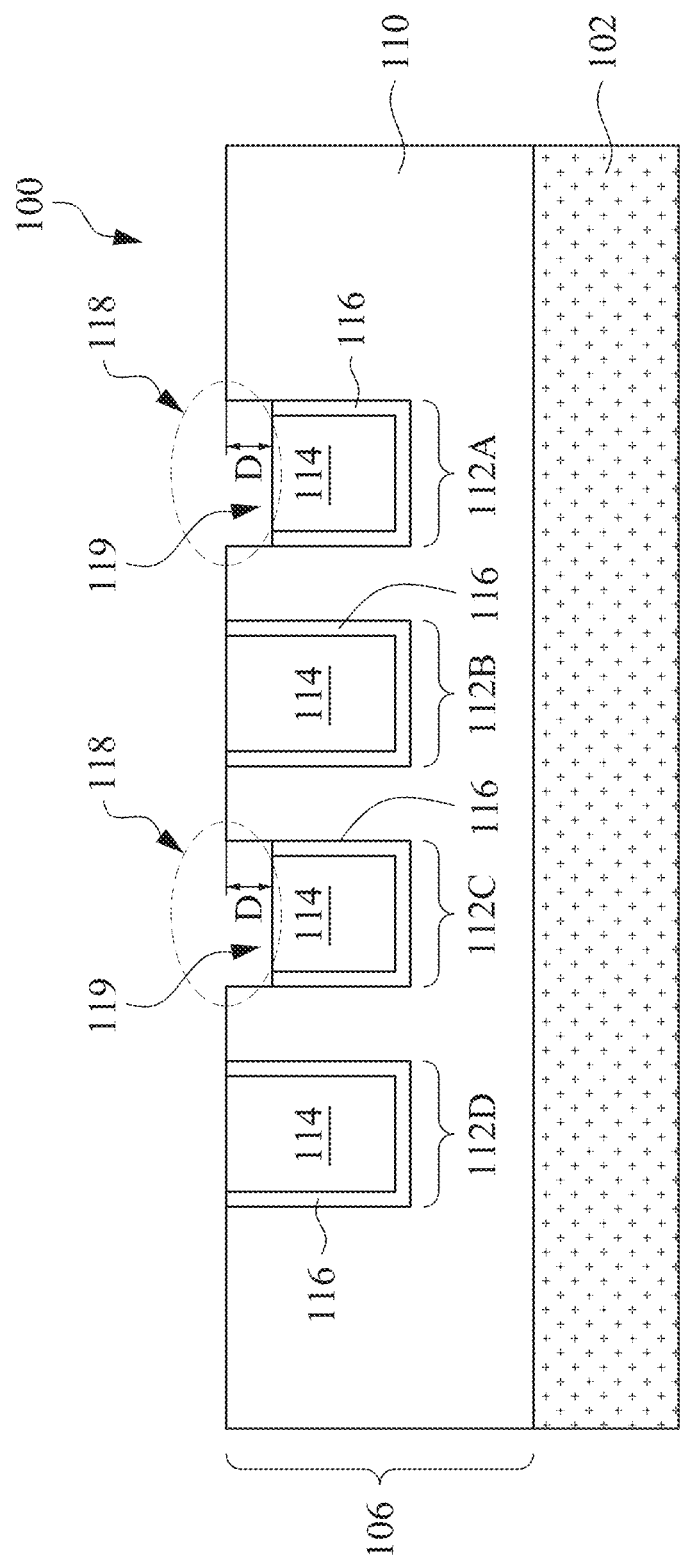
FIG. 5 is a cross-sectional view of the semiconductor structure of FIG. 4 after recessing the non-via landing portions of the first and third lower level conductive lines to form recesses, in accordance with some embodiments.

Referring to FIG. 2 and FIG. 5, execution of method 200 comprises performing operation 206 in which the non-via landing portion 118 of each of the first lower level conductive line 112A and the third lower level conductive line 112C that is exposed by the patterned photoresist layer 115 is recessed to form a recess 119 above the non-via landing portion 118 of each of the first lower level conductive line 112A and the third lower level conductive line 112C. In some embodiments, an etch back process is performed to remove an upper portion of the non-via landing portion 118 of each of the first lower level conductive line 112A and the third lower level conductive line 112C such that the top surface of non-via landing portion 118 of each of the first lower level conductive line 112A and the third lower level conductive line 112C is below the top surface of the first dielectric layer 110. In some embodiments, the etch back process includes a dry etch, a wet etch, or a combination thereof. In some embodiments, metal portion 114 and the metal liner 116 in each of the first lower level conductive line 112A and the third lower level conductive line 112C are etched using separate etching processes. For example, a mixture of gases including $SF_6$, nitrogen, and chlorine is utilized to etch the metal portion 114, and an alkaline solution including an aqueous mixture of ammonium hydroxide and hydrogen peroxide is employed to etch the metal liner 116. The recess 119 is formed to have a depth D that determines a thickness of a dielectric cap 121 (FIGS. 1A and 1B) subsequently formed in each recess 119. In some embodiments, the depth D of each recess 119 is from about 1 nm to about 20 nm. After forming the recesses 119, the patterned photoresist layer 115 is removed, for example, by wet stripping or plasma ashing.

Figure 6:
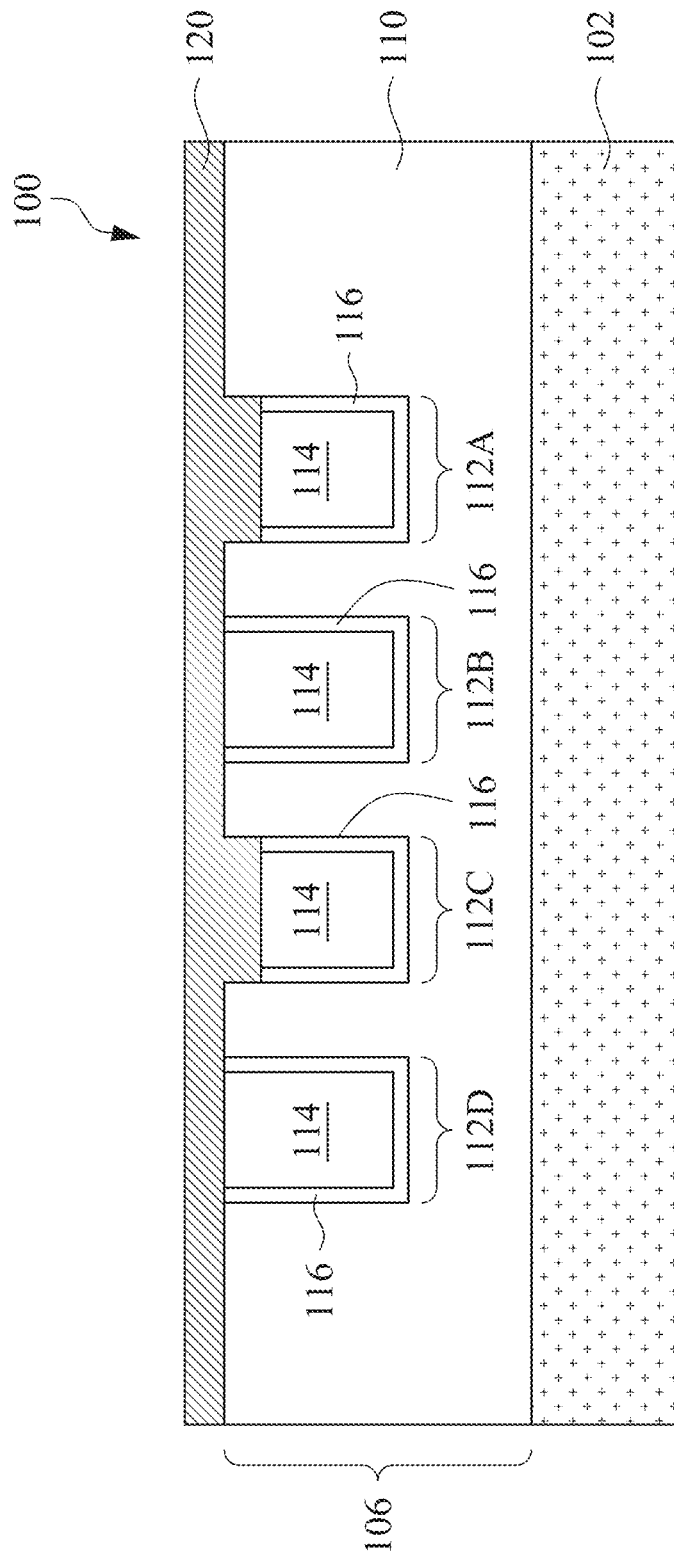
FIG. 6 is a cross-sectional view of the semiconductor structure of FIG. 5 after depositing a dielectric cap layer to fill the recesses, in accordance with some embodiments.

Referring to FIG. 2 and FIG. 6, execution of method 200 comprises performing operation 208 in which a dielectric cap layer 120 is deposited in the recesses 119 to fill the recesses 119. The dielectric cap layer 120 covers the first dielectric layer 110 and the lower level conductive lines 112A, 112B, 112C and 112D. In some embodiments, the dielectric cap layer 120 includes silicon carbide, silicon oxycarbide, silicon nitride, nitrogen-doped carbide (NDC), or a combination thereof. In some embodiments, the dielectric cap layer 120 includes a high-k dielectric material such as, for example, $HfO_2$, $ZrO_2$, $La_2O_3$, $Al_2O_3$, $TiO_2$, $SrTiO_3$, $LaAlO_3$, or $Y_2O_3$. In some embodiments, the dielectric cap layer 120 is deposited using CVD, PECVD, PVD, ALD, or other suitable deposition processes. In some embodiments, the dielectric cap layer 120 includes a same material as the first dielectric layer 110. In some embodiments, the dielectric cap layer 120 includes a material different from the first dielectric layer 110.

Figure 7:
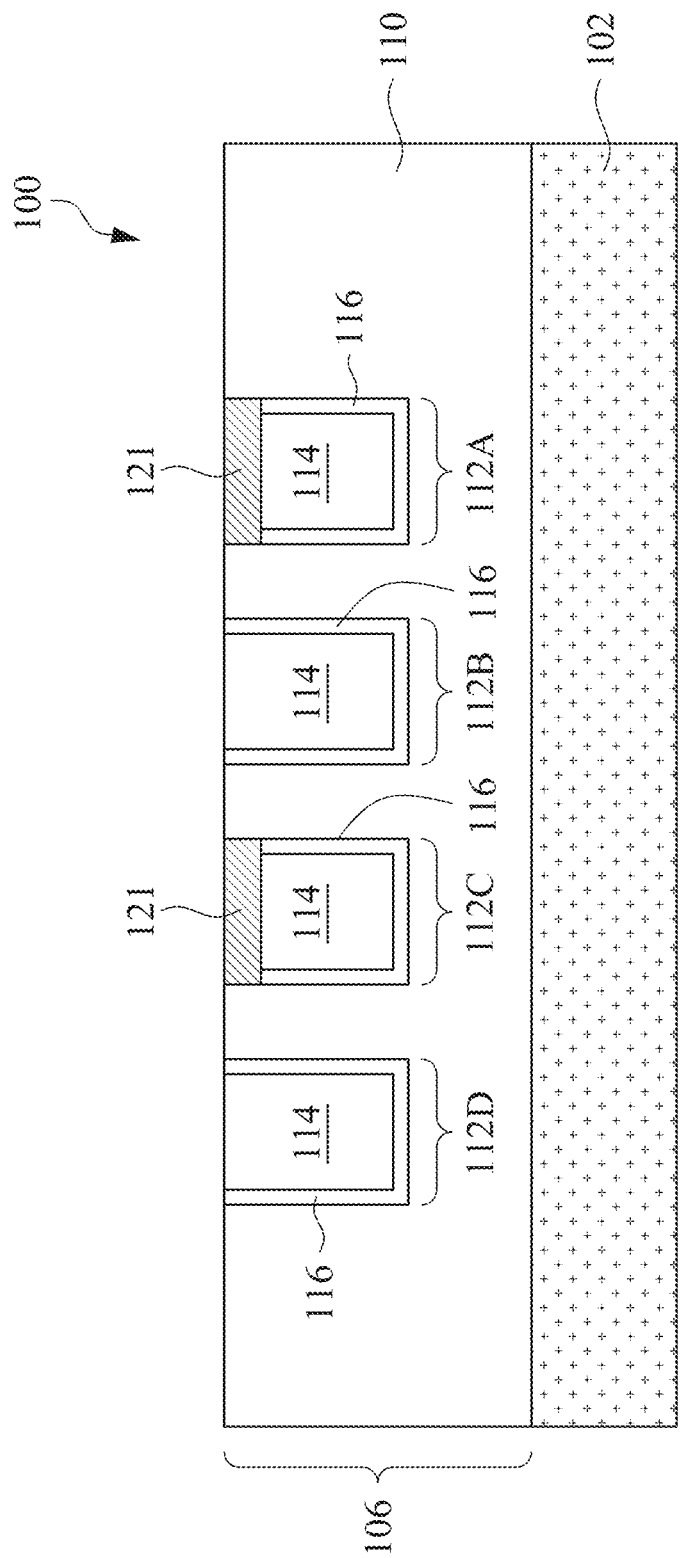
FIG. 7 is a cross-sectional view of the semiconductor structure of FIG. 6 after forming dielectric caps in the recesses, in accordance with some embodiments.

Referring to FIG. 2 and FIG. 7, execution of method 200 comprises performing operation 210 in which dielectric caps 121 are formed within recesses 119, covering the non-via landing portions 118 of the first and third lower level conductive lines 112A and 112C. In some embodiments, dielectric caps 121 are formed by removing a portion of the dielectric cap layer 120 above the top surface of the first dielectric layer 110. In some embodiments, the removal process includes performing a planarization process. In some embodiments, the planarization process includes a CMP process. After the planarization process, the dielectric caps 121 each have a top surface coplanar with the top surface of the first dielectric layer 110. The dielectric caps 121 in the recesses 119 are configured to have a sufficient thickness to prevent shorting of the target lower level conductive line 112B with the neighboring first lower level conductive line 112A or third lower level conductive line 112C. In some embodiments, each dielectric cap 121 has a thickness ranging from about 1 nm to about 20 nm. If the dielectric cap 121 is too thin, the dielectric cap 121 is unable to sufficiently insulate the target lower level conductive line 112B with the neighboring first lower level conductive line 112A or third lower level conductive line 112C when via misalignment occurs, in some instances. On the other hand, if the dielectric cap 121 is too thick, the sheet resistance of the dielectric cap 121 becomes too high which adversely affects the RxC (resistancexcapacitance) delay performance, in some instances.

Figure 8:
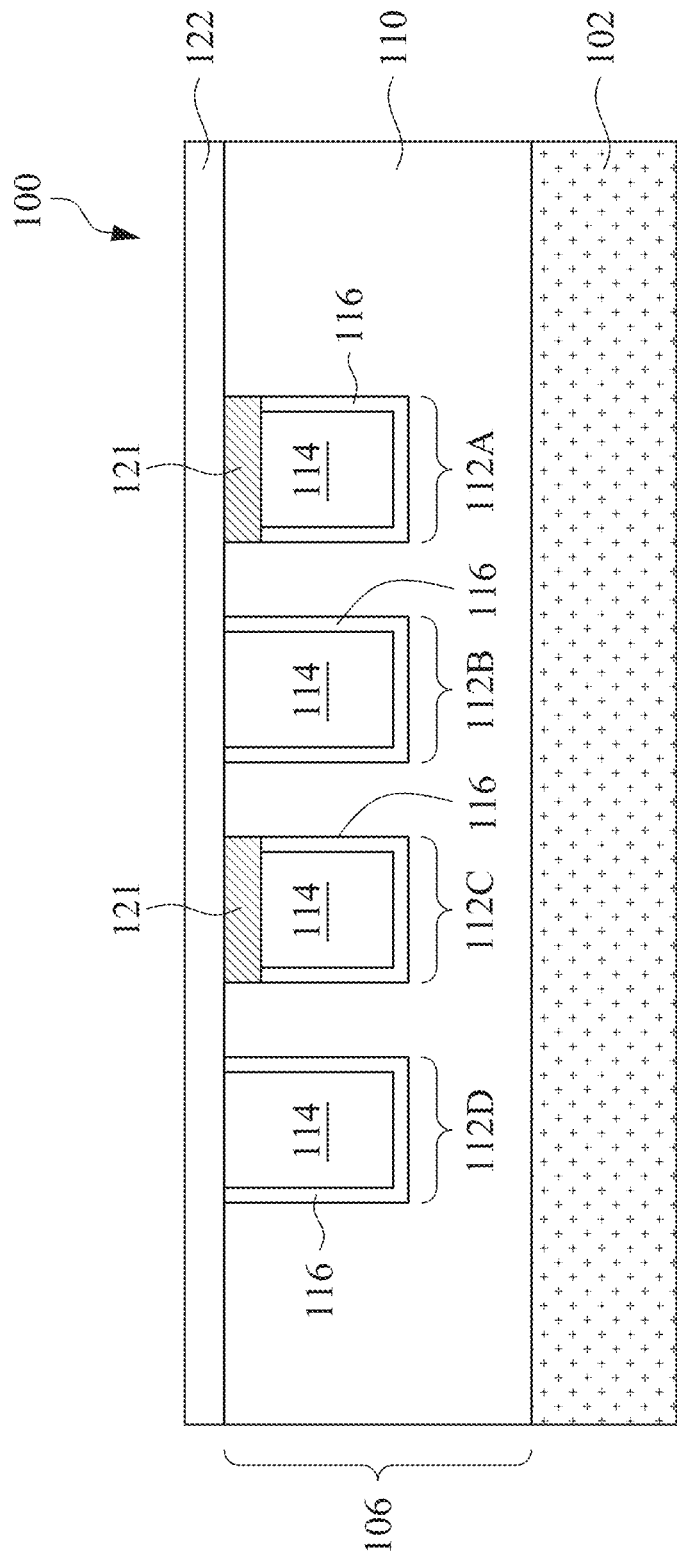
FIG. 8 is a cross-sectional view of the semiconductor structure of FIG. 7 after forming an etch stop layer over the first dielectric layer, the plurality of lower level conductive lines and the dielectric caps, in accordance with some embodiments.

Referring to FIG. 2 and FIG. 8, execution of method 200 comprises performing operation 212 in which an etch stop layer 122 is deposited over the first dielectric layer 110, the lower level conductive lines 112A, 112B, 112C and 112D, and the dielectric caps 121. The etch stop layer 122 is used to control the end point during subsequent damascene processes for formation of trenches and via openings. In some embodiments, the etch stop layer 122 includes a dielectric material having a high etching selectivity with respect to the first dielectric layer 110. In some embodiments, the etch stop layer 122 includes silicon carbide, silicon nitride, silicon oxynitride, silicon carbonitride, silicon oxycarbide, or other suitable dielectric materials. In some embodiments, the etch stop layer 122 includes a dielectric material that is different from the dielectric material providing the dielectric caps 121. In some embodiments, the etch stop layer 122 includes a dielectric material that is the same as the dielectric material providing the dielectric caps 121. In some embodiments, the etch stop layer 122 is deposited using CVD, PECVD, PVD, ALD, or other suitable deposition processes. The etch stop layer 122 is optional and is omitted in some embodiments.

Figure 9:
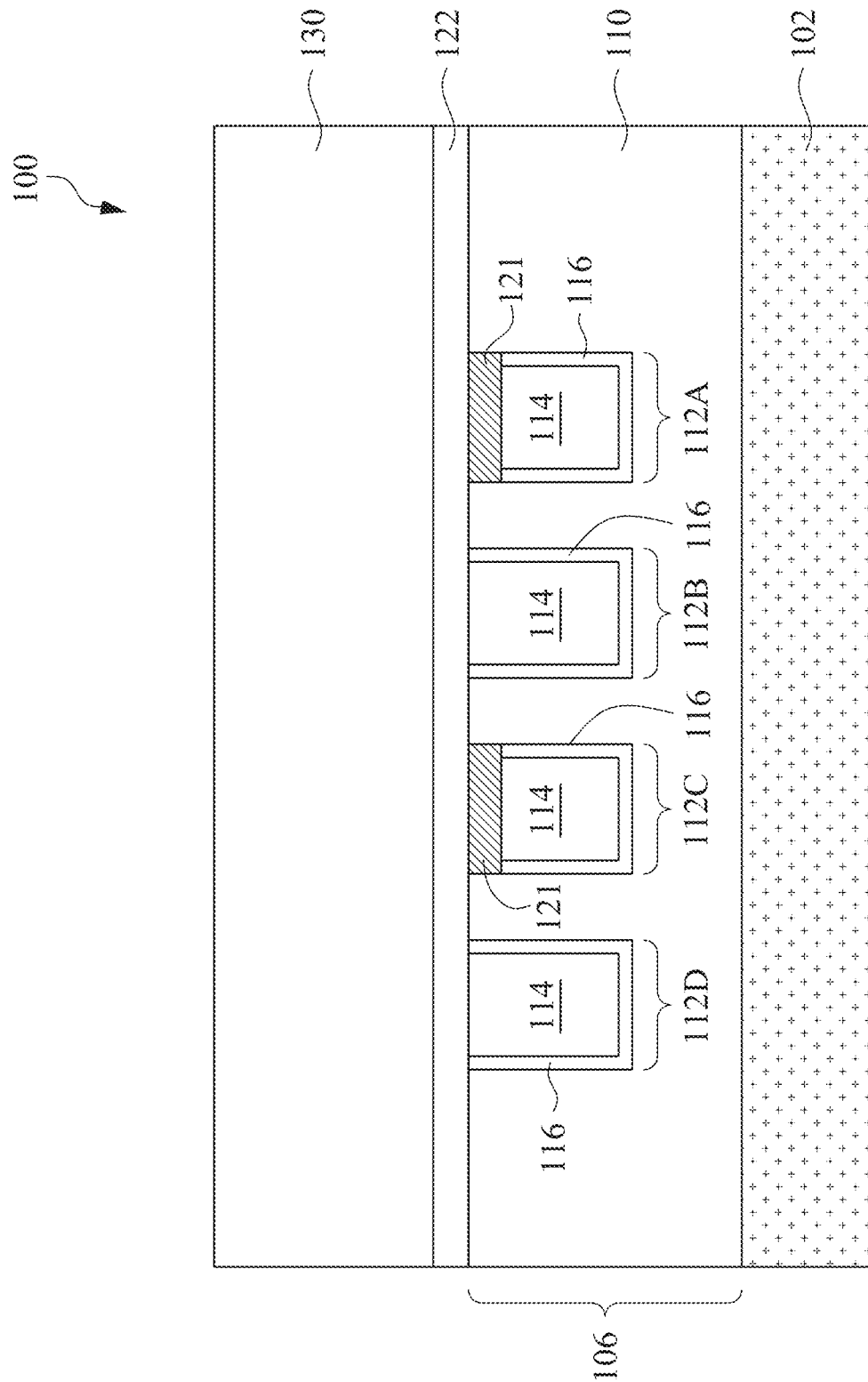
FIG. 9 is a cross-sectional view of the semiconductor structure of FIG. 8 after forming a second dielectric layer over the etch stop layer, in accordance with some embodiments.

Referring to FIG. 2 and FIG. 9, execution of method 200 comprises performing operation 214 in which a second dielectric layer 130 is deposited over the first dielectric layer or over the etch stop layer 122, if present. The second dielectric layer 130 includes a dielectric material that is the same or different from the dielectric material providing the first dielectric layer 110. For example, the second dielectric layer 130 includes a low-k dielectric material such as tetraethylorthosilicate (TEOS) oxide, undoped silicate glass, doped silicate glass such as borophosphosilicate glass (BPSG), fused silica glass (FSG), phosphosilicate glass (PSG), or boron doped silicon glass (BSG). In some embodiments, the second dielectric layer 130 is deposited using CVD, PECVD, PVD, spin coating, or other suitable deposition process. In some embodiments, the second dielectric layer 130 is planarized by a planarization process or otherwise recessed to provide a planar top surface. In some embodiments, the second dielectric layer 130 is planarized using a CMP process. In some embodiments, the second dielectric layer 130 includes a same material as the dielectric cap layer 120 and the first dielectric layer 110. In some embodiments, the second dielectric layer 130 includes a different material from at least one of the dielectric cap layer 120 or the first dielectric layer 110.

Figure 10:
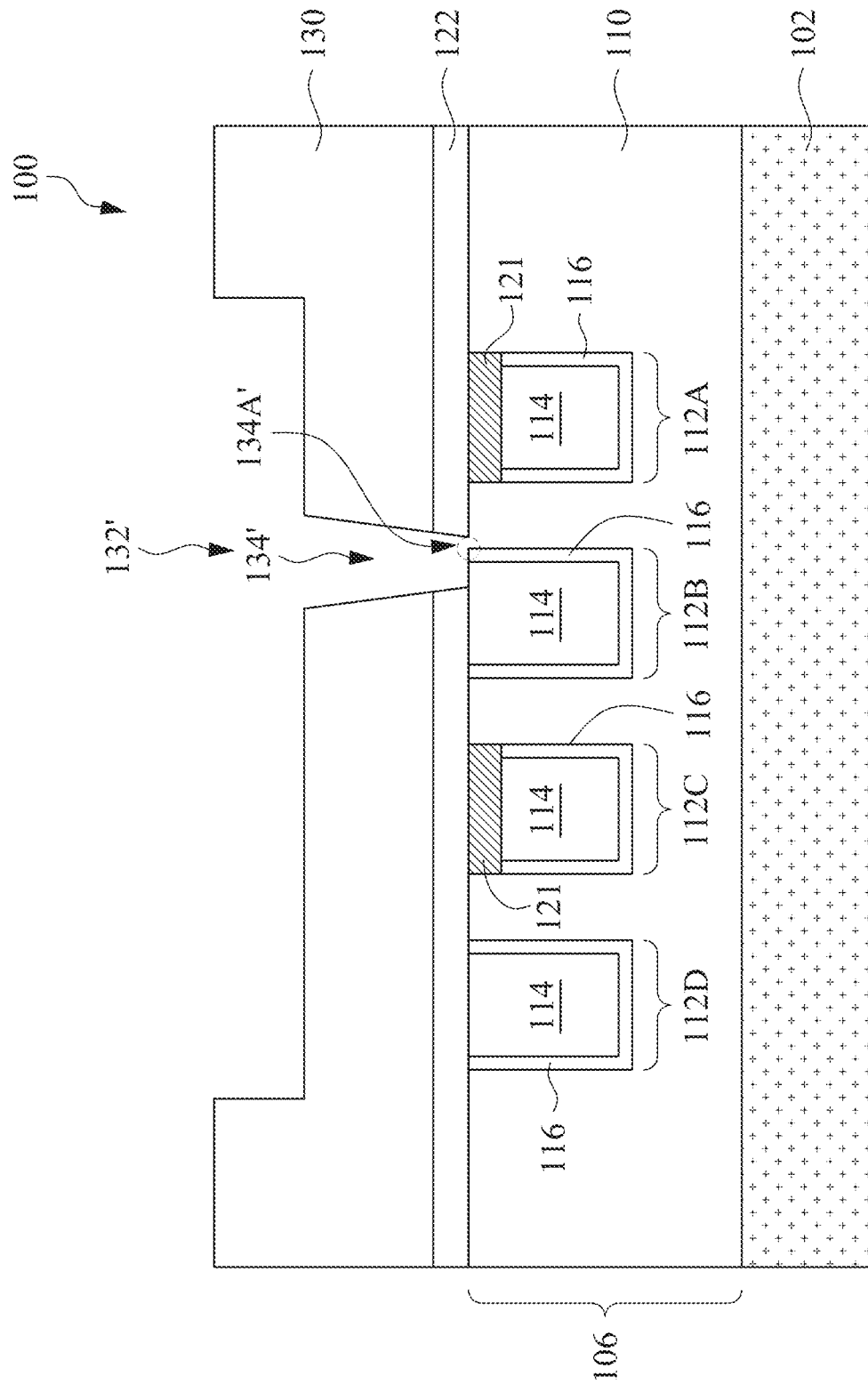
FIG. 10 is a cross-sectional view of the semiconductor structure of FIG. 9 after forming a trench and a via opening in the second dielectric layer and the etch stop layer to expose a via landing portion of the second lower level conductive line, in accordance with some embodiments.

Referring to FIG. 2 and FIG. 10, execution of method 200 comprises performing operation 216 in which a trench 132' and a via opening 134' are formed to expose a portion of the second lower level conductive line 112B. The trench 132' envelopes the foot print of the via opening 134'.

In some embodiments, the trench 132' and the via opening 134' are formed using a dual damascene process. In some embodiments, the trench 132' and the via opening 134' are formed using a trench-first scheme. For example, a first lithography and etching process is performed to define the trench 132' in an upper portion of the second dielectric layer 130. The first lithography process includes applying a first photoresist layer (not shown) over the second dielectric layer 130, exposing the first photoresist layer to a pattern of radiation, performing post-exposure bake processes, and developing the first photoresist layer to form a patterned first photoresist layer (not shown). The second dielectric layer 130 is subsequently etched using the first patterned photoresist layer as an etch mask, forming the trench 132' in the upper portion of the second dielectric layer 130. The etching process includes anisotropic etch such as a RIE or a plasma etch. After formation of the trench 132', the patterned first photoresist layer is removed, for example, by wet stripping or plasma ashing. Next, a second lithography and etching process is performed to define the via opening 134' within the trench 132'. The via opening 134' extends through the second dielectric layer 130 and the etch stop layer 122, if present. The second lithography process includes applying a second photoresist layer (not shown) over the second dielectric layer 130 to fill the trench 132'. The second photoresist layer is then patterned by exposing the second photoresist layer to a pattern of radiation, performing post-exposure bake processes, and developing the second photoresist layer to form a patterned second photoresist layer (not shown). Once the patterned second photoresist layer is formed, one or more anisotropic processes are performed to etch the second dielectric layer 130 and the etch stop layer 122 using the second patterned photoresist layer as an etch mask forming the via opening 134' beneath the trench 132'. After formation of the via opening 134', the patterned second photoresist layer is removed, for example, by wet stripping or plasma ashing. Alternatively, in some embodiments, the trench 132' and the via 134' are formed using a via-first scheme. The formation processes include performing a first lithography and etching process to form a first patterned photoresist layer (not shown) and etch the second dielectric layer 130 using the first patterned photoresist layer as an etch mask to form an initial via opening (not shown), wherein the initial via opening extends from the top surface of the second dielectric layer 130 to an intermediate level between the top surface and the bottom surface of the second dielectric layer 130. Next, a second lithography and etching process is performed to form a second patterned photoresist layer (not shown) to define the pattern of the trench 132'. An anisotropic etch is then performed to form the trench 132' in an upper portion of the second dielectric layer 130 using the second patterned photoresist layer as an etch mask. As the trench 132' forms, the anisotropic etch utilized in formation of the trench 132' extends the initial via opening down through the remaining portion of the second dielectric layer 130 and the etch stop layer 122, hence forming the via opening 134' beneath the trench 132'.

In some instances, overlay errors occur during the formation of the via opening 134', resulting in misalignment of the via opening 134'. The via opening 134' is formed to extend beyond an edge of the second lower level conductive line 112B. In some embodiments, in FIG. 10, although the via opening 134' is shown to extend beyond a right edge of the second lower level conductive line 112B, a situation in which the via opening 134' extends beyond a left edge of the second lower level conductive line 112B is contemplated in the present disclosure. Furthermore, in some embodiments, the overlay errors cause a portion of the second dielectric layer 130 to be etched, the via opening 134' thus includes a gouging portion 134A' in the first dielectric layer 110, exposing a sidewall of the second lower level conductive line 112B.

Figure 11:
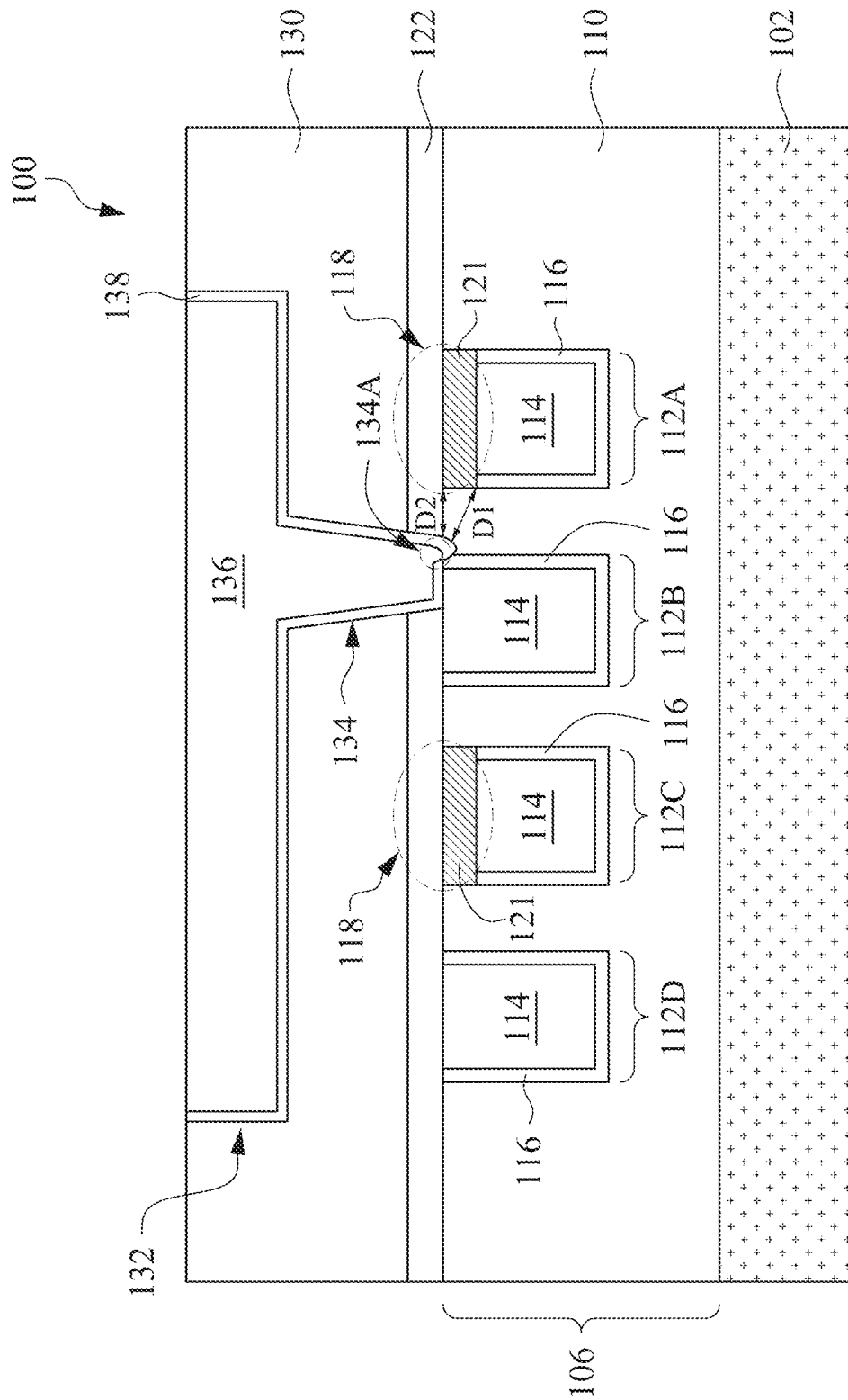
FIG. 11 is a cross-sectional view of the semiconductor structure of FIG. 10 after forming an upper level conductive line and a via in the trench and the via opening, respectively, in accordance with some embodiments.
Figure 12:
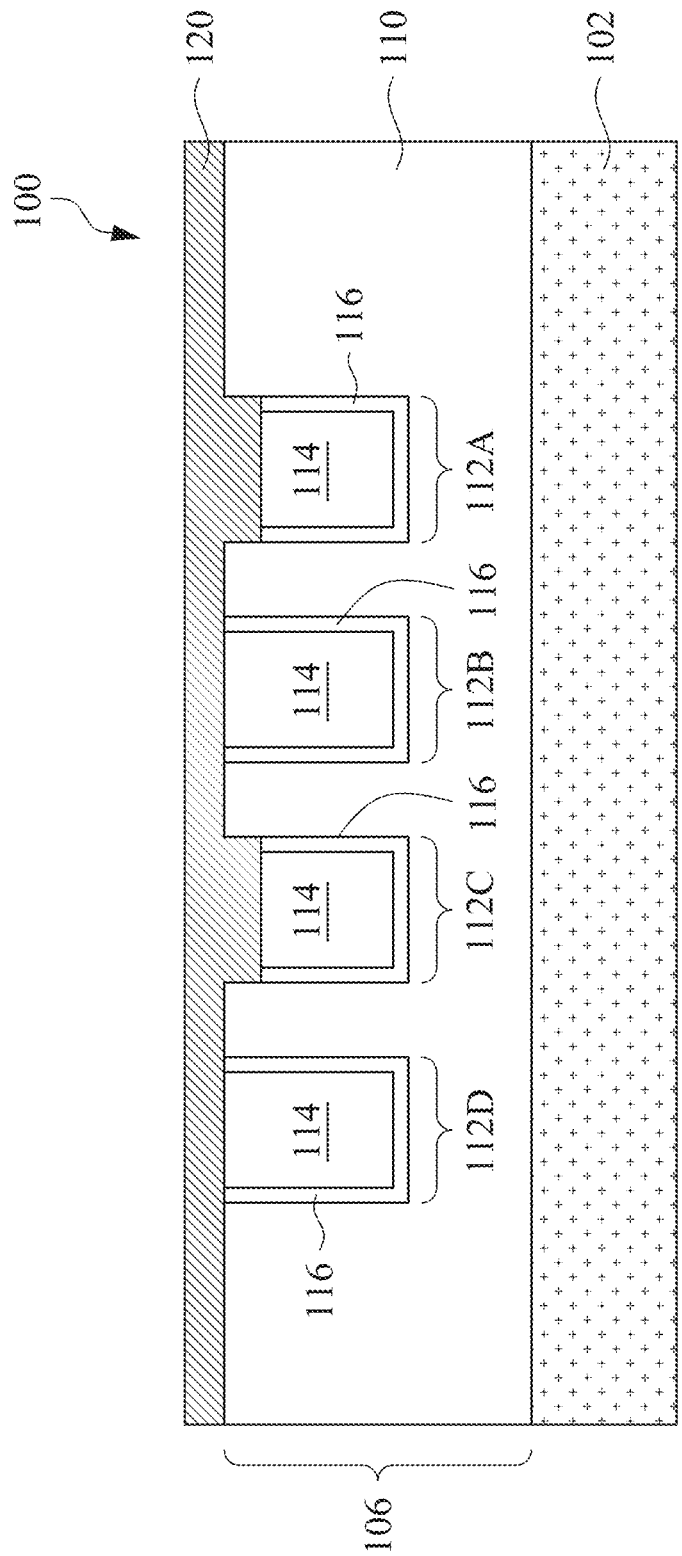
FIG. 12 is a cross-sectional view of a semiconductor structure having a same structure as the semiconductor structure of FIG. 6, in accordance with some embodiments.

Referring to FIG. 2 and FIG. 11, execution of method 200 comprises performing operation 218 in which an upper level conductive line 132 and a via 134 are formed in the trench 132' and the via opening 134', respectively. In some embodiments, the via 134 includes a portion 134A embedded in the first dielectric layer 110. The via 134 interconnects the upper level conductive line 132 and the second lower level conductive line 112B. The upper level conductive line 132 includes a metal portion 136 and a metal liner 138 surrounding the metal portion 136. The metal liner 138 is optional and is omitted in some embodiments.

In some embodiments, the upper level conductive line 132 and the via 134 are formed by depositing a second metal liner layer (not shown) on sidewalls and bottoms of the trench 132' and the via opening 134' and on the top surface of the second dielectric layer. In some embodiments, the second metal liner layer includes a diffusion barrier material that prevents the metal in the metal portions 136 from diffusing into the second dielectric layer 130. In some embodiments, the second metal liner layer includes a same material as the first metal liner layer used for formation of metal liners 116 in the lower level conductive lines 112A, 112B, 112C and 112D. In some embodiments, the second metal liner layer includes a different material from the first metal liner layer used for formation of metal liners 116 in the lower level conductive lines 112A, 112B, 112C and 112D. For example, in some embodiments, the second metal liner layer includes Ti, TiN, Ta, TaN, Ru, RuN, or other suitable diffusion barrier materials. In some embodiments, the second metal liner layer includes a stack of the above-mentioned diffusion barrier materials such as, for example, Ti/TiN or Ta/TaN. In some embodiments, the second metal liner layer is deposited utilizing a conformal deposition process such as CVD, PECVD, PVD, or ALD.

Subsequently, a second metal layer (not shown) is deposited over the second metal liner layer to fill the trench 132' and the via opening 134'. In some embodiments, the second metal layer includes a same material as the first metal layer used for formation of metal portions 114 in the lower level conductive lines 112A, 112B, 112C and 112D. In some embodiments, the second metal layer includes a different material from the first metal layer used for formation of metal portions 114 in the lower level conductive lines 112A, 112B, 112C and 112D. For example, in some embodiments, the second metal layer includes Cu, Al, W, Co, an alloy thereof, or other suitable conductive metals. In some embodiments, the second metal layer is deposited by a suitable deposition process such as, for example, CVD, PECVD, sputtering, or plating. The deposition process is continued until the conductive material fills the trench 132' and the via opening 134' and extends above the second dielectric layer 130. In some embodiments when Cu or a Cu alloy is employed in the first metal layer, an optional plating seed layer (not shown) is formed on the second liner layer prior to the formation of the second metal layer. In some embodiments, the optional plating seed layer is formed by a deposition process including, for example, CVD, PECVD, ALD, and PVD.

Thereafter, portions of the second metal layer and the second metal liner layer that are located above the top surface of the second dielectric layer 130 are removed using a planarization process. In some embodiments, a CMP process is performed to remove excess diffusion barrier material and conductive metal from the top surface of the second dielectric layer 130. After the planarization, a portion of the second metal layer remaining in the trench 132' and the via opening 134' constitute the metal portion 136, a portion of the second metal liner layer remaining in the trench 132' and the via opening 134' constitute the metal liner 138. After the CMP process, a top surface of the upper level conductive line 132 is coplanar with the top surface of the second dielectric layer 130.

In some embodiments, due to the misalignment of the via opening 134', the via 134 subsequently formed within the via opening 134' extends beyond an edge of the second lower level conductive line 112B. Introducing dielectric caps 121 on the non-via landing portions 118 of both neighboring lower level conductive lines, i.e., the first and third lower level conductive lines 112A and 112C, helps to increase the via to conductive line margin no matter with which side of the target lower level conductive line 112B the via 134 is misaligned. As a result, the accidental shorting of the target lower level conductive line 112B with the neighboring lower level conductive line 112A or 112C is avoided. The dielectric caps 121 also help to eliminate the current leakage between the target lower level conductive line 112B and the neighboring lower level conductive line 112A or 112C, which helps to eliminate the dielectric breakdown and improve the wiring reliability.

FIGS. 12-15 are cross-section views of intermediate stages in the formation of the semiconductor structure 100, in accordance with alternative embodiments. Unless specified otherwise, the materials and the formation methods of the components in these embodiments are essentially the same as their like components, which are denoted by like reference numerals in the embodiments shown in FIGS. 2-11. The details regarding the formation processes and the materials of the components shown in FIGS. 12-15 are thus found in the discussion of the embodiments shown in FIGS. 2-11.

Figure 13:
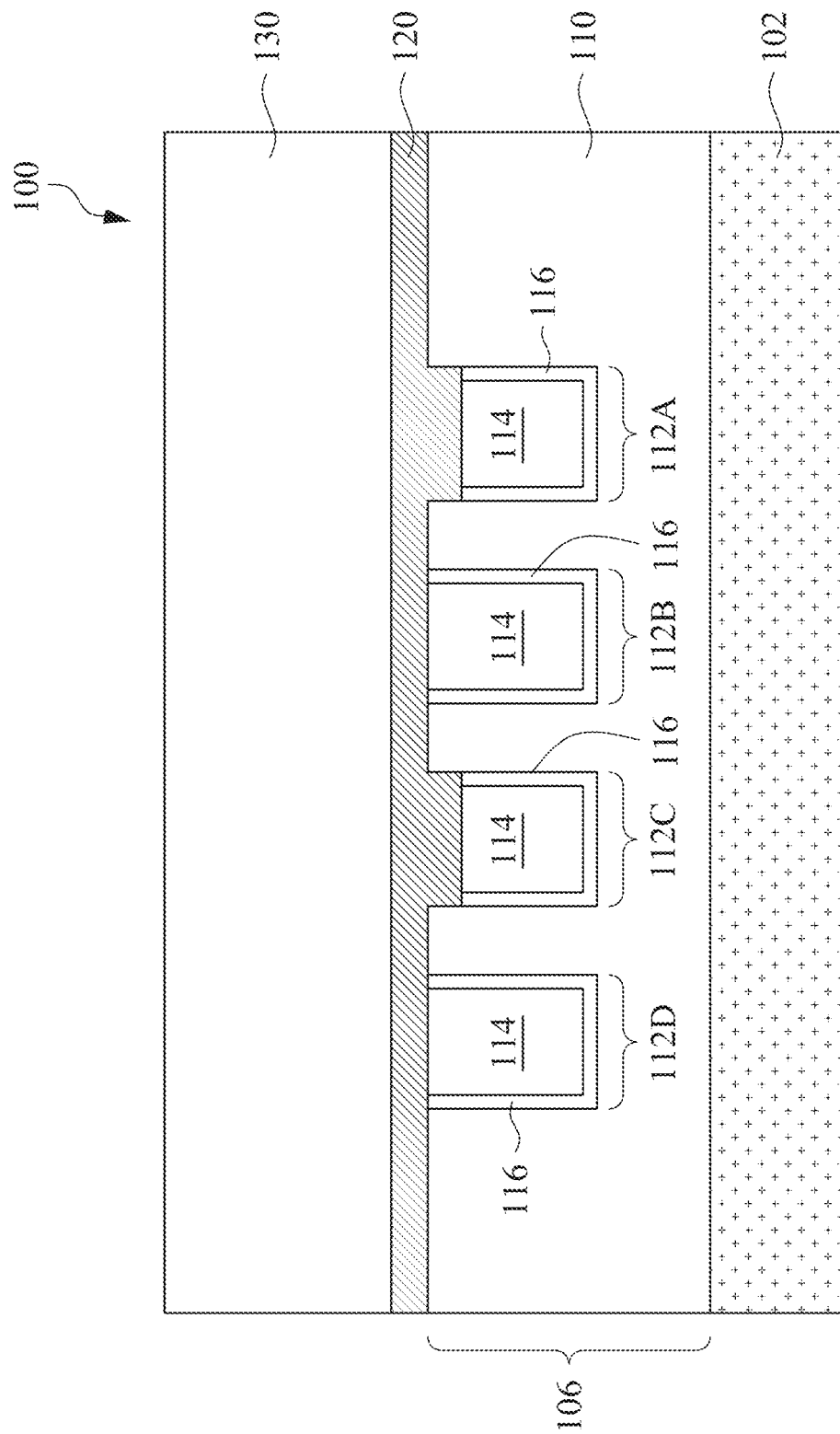
FIG. 13 is a cross-sectional view of the semiconductor structure of FIG. 12 after forming a second dielectric layer over the dielectric cap layer, in accordance with some embodiments.

The initial steps of these embodiments are similar to those in FIGS. 2-6 and FIG. 12 includes a structure that is similar to that in FIG. 6. After formation of dielectric cap layer 120 over the first dielectric layer 110 and the lower level conductive lines 112A, 112B, 112C and 112C to fill recesses 119 in FIG. 12, in FIG. 13, rather than performing operation 210 to remove a portion of the dielectric cap layer 120 that is above the first dielectric layer 110 and subsequently performing operation 212 to form an etch stop layer 122 over the first dielectric layer 110, in the alternative embodiments, operations 210, 212 in the execution of method 200 are omitted. In FIG. 13, the method 200 (FIG. 2) proceeds to operation 214 after depositing the dielectric cap layer at operation 210, where a second dielectric layer 130 is formed over the dielectric cap layer 120. A portion of the dielectric cap layer 120 located within each recess 119 forms the dielectric cap 121, while a portion of the dielectric cap layer 120 located above the first dielectric layer 110 serves as an etch stop layer, performing a function the same as the etch stop layer 122 in FIG. 8.

Figure 14:
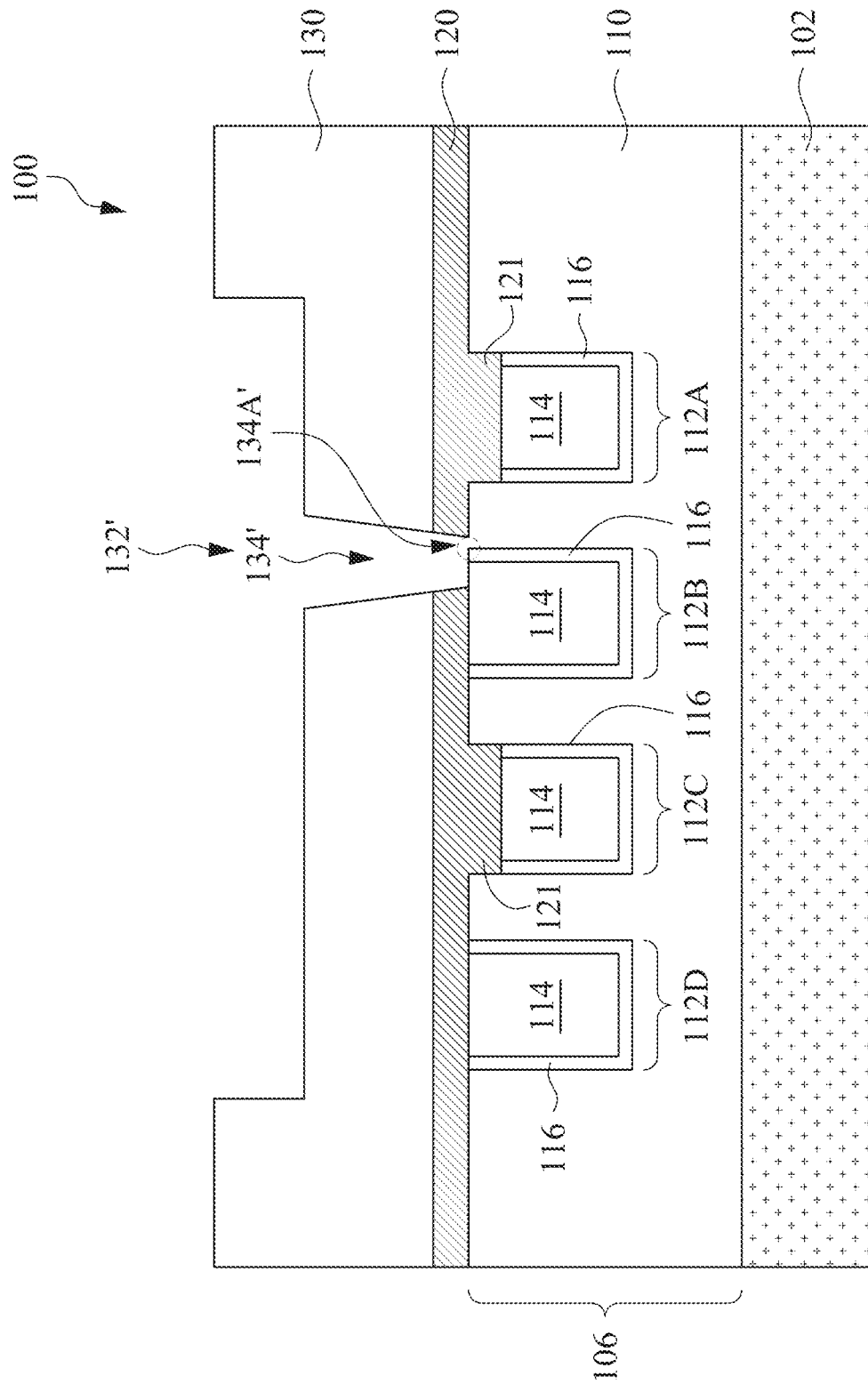
FIG. 14 is a cross-sectional view of the semiconductor structure of FIG. 13 after forming a trench and a via opening in the second dielectric layer and the dielectric cap layer to expose a via landing portion of the second lower level conductive line, in accordance with some embodiments.
Figure 15:
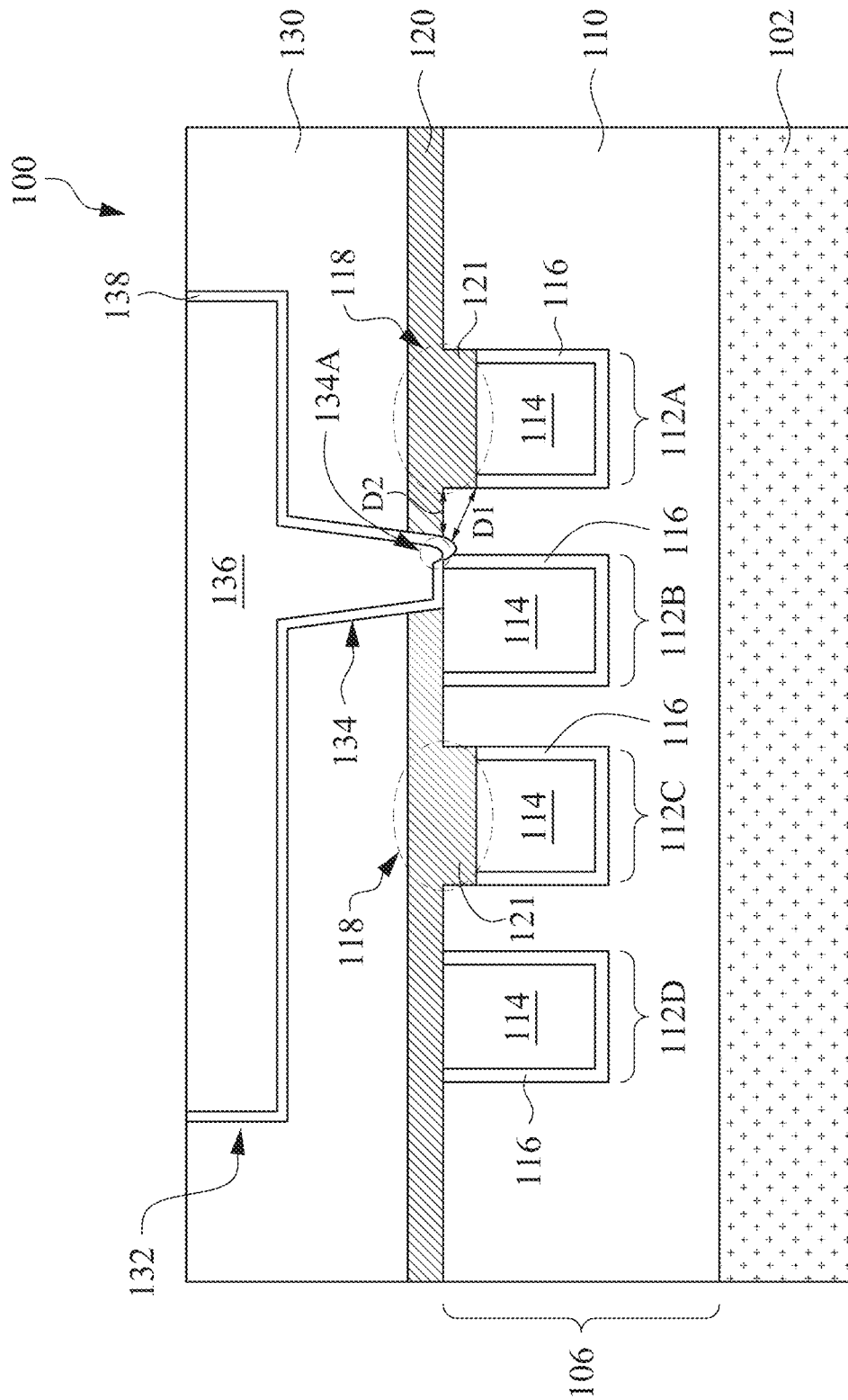
FIG. 15 is a cross-sectional view of the semiconductor structure of FIG. 14 after forming an upper level conductive line and a via in the trench and the via opening, respectively, in accordance with some embodiments.

FIG. 14 is a view after formation of a trench 132' in an upper portion of the second dielectric layer 130 and a via opening 134' extending through a lower portion of the second dielectric layer 130 and the dielectric cap layer 120. FIG. 15 is a view after formation of an upper level conductive line 132 and a via 134 in the trench 132' and in the via opening 134', respectively. The formation processes are similar to the processes described above with respect to FIGS. 10 and 11, and hence are not described in detail.

One aspect of this description relates to a semiconductor structure. The semiconductor structure includes a first conductive line and a second conductive line in a first dielectric layer. The first conductive line and the second conductive line each extend along a first direction. The semiconductor structure further includes a third conductive line in a second dielectric layer overlying the first dielectric layer. The third conductive line extends along a second direction different from the first direction and above at least the second conductive line. The semiconductor structure further includes a via in the second dielectric layer and electrically connecting the second conductive line and the third conductive line. The via lands on a portion of the second conductive line. The semiconductor structure further includes a dielectric cap over the first conductive line. A bottom surface of the dielectric cap is below a top surface of the first dielectric layer. In some embodiments, the first direction is perpendicular to the second direction. In some embodiments, the via extends beyond an edge of the second conductive line in the second direction. The portion of the second conductive line where the via is landed has a top surface above a top surface of a portion of the first conductive line below the dielectric cap. In some embodiments, the dielectric cap has a top surface coplanar with the top surface of the first dielectric layer. In some embodiments, the dielectric cap comprises silicon carbide, silicon nitride, nitrogen-doped carbide, or a high-k dielectric material. In some embodiments, the semiconductor structure further includes an etch stop layer between the first dielectric layer and the second dielectric layer. The via extends through a lower portion of the second dielectric layer and the etch stop layer to contact the portion of the second conductive line. In some embodiments, the etch stop layer includes a same dielectric material as the dielectric cap. In some embodiments, the etch stop layer includes a different dielectric material from the dielectric cap. In some embodiments, the dielectric cap has a thickness from about 1 nm to about 20 nm. In some embodiments, a portion of the via is embedded in the first dielectric layer. In some embodiments, the first dielectric layer and the second dielectric layer each include a low-k dielectric material.

Another aspect of this description relates to a semiconductor structure. The semiconductor structure includes a substrate, a first dielectric layer over the substrate, a plurality of lower level conductive lines in the first dielectric layer and extending along a first direction, an etch stop layer over the first dielectric layer, a second dielectric layer over the etch stop layer, an upper level conductive line in an upper portion of the second dielectric layer and extending along a second direction perpendicular to the first direction, a via extending through a lower portion of the second dielectric layer and the etch stop layer and coupling the upper level conductive line to a target lower level conductive line of the plurality of lower level conductive lines, and a dielectric cap over a portion of each of neighboring lower level conductive lines of the plurality of lower level conductive lines on opposite sides of the target lower level conductive line. Each dielectric cap is adjacent to the via and is below the etch stop layer. In some embodiments, a spacing between the target lower level conductive line and each of the neighboring lower level conductive lines of the plurality of lower level conductive lines is a minimum conductive line spacing allowed by design rules according to a manufacturing process.

Still another aspect of this description relates to a method of forming a semiconductor structure. The method includes forming a plurality of lower level conductive lines in a first dielectric layer. The plurality of lower level conductive lines includes a first lower level conductive line, a second lower level conductive line adjacent to the first lower level conductive line, and a third lower level conductive line adjacent to the second lower level conductive line. The method further includes recessing portions of the first lower level conductive line and the third lower level conductive line below a top surface of the first dielectric layer to form recesses, forming dielectric caps in the recesses, depositing a second dielectric layer over the first dielectric layer, and forming a trench and a via opening in the second dielectric layer. The via opening exposes a portion of the second lower level conductive line adjacent to the dielectric caps. The method further includes forming an upper level conductive line and a via in the trench and in the via opening, respectively. The via couples the upper level conductive line to the second lower level conductive line, and the upper level conductive line overlaps with the dielectric caps. In some embodiments, forming the trench and the via opening in the second dielectric layer includes forming a via opening exposes a sidewall of the exposed portion of the second lower level conductive line adjacent to the one of the dielectric caps. In some embodiments, forming the dielectric caps includes forming a dielectric cap layer over the first dielectric layer and the plurality of lower level conductive lines. Portions of the dielectric cap layer within the recesses provide the dielectric caps, and the second dielectric layer is formed over the dielectric cap layer. In some embodiments, forming the trench and the via opening includes etching the second dielectric layer and the dielectric cap layer. The trench extends through an upper portion of the second dielectric layer, and the via opening extends through a lower portion of the second dielectric layer and the dielectric cap layer. In some embodiments, forming the dielectric caps includes forming a dielectric cap layer over the first dielectric layer and the plurality of lower level conductive lines such that the dielectric cap layer fills the recesses, and removing a portion of the dielectric cap layer above the top surface of the first dielectric layer from the top surface of the first dielectric layer. Portions of the dielectric cap layer remaining within the recesses constitute the dielectric caps. In some embodiments, the method further includes forming an etch stop layer over the first dielectric layer, the dielectric caps and the plurality of lower level conductive lines. Forming the trench and the via opening includes etching the second dielectric layer and the etch stop layer, wherein the trench extends through an upper portion of the second dielectric layer, and the via opening extends through a lower portion of the second dielectric layer and the etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first conductive line and a second conductive line in a first dielectric layer, wherein the first conductive line and the second conductive line each extend along a first direction;
a third conductive line in a second dielectric layer overlying the first dielectric layer, wherein the third conductive line extends along a second direction different from the first direction and above at least the second conductive line;
a via in the second dielectric layer and electrically connecting the second conductive line and the third conductive line, wherein the via lands on a portion of the second conductive line; and
a dielectric cap over the first conductive line, wherein a bottom surface of the dielectric cap is below a top surface of the first dielectric layer, wherein the portion of the second conductive line where the via is landed has a top surface above a top surface of a portion of the first conductive line below the dielectric cap.

2. The semiconductor structure of claim 1, wherein the first direction is perpendicular to the second direction.

3. The semiconductor structure of claim 1, wherein the via extends beyond an edge of the second conductive line in the second direction.

4. The semiconductor structure of claim 1, wherein the dielectric cap has a top surface coplanar with the top surface of the first dielectric layer.

5. The semiconductor structure of claim 1, wherein the dielectric cap comprises silicon carbide, silicon nitride, nitrogen-doped carbide, or a high-k dielectric material.

6. The semiconductor structure of claim 1, further comprising an etch stop layer between the first dielectric layer and the second dielectric layer, wherein the via extends through a lower portion of the second dielectric layer and the etch stop layer to contact the portion of the second conductive line.

7. The semiconductor structure of claim 6, wherein the etch stop layer comprises a same dielectric material as the dielectric cap.

8. The semiconductor structure of claim 6, wherein the etch stop layer comprises a different dielectric material from the dielectric cap.

9. The semiconductor structure of claim 1, wherein the dielectric cap has a thickness from about 1 nm to about 20 nm.

10. The semiconductor structure of claim 1, wherein a portion of the via is embedded in the first dielectric layer.

11. The semiconductor structure of claim 1, wherein the first dielectric layer and the second dielectric layer each comprise a low-k dielectric material.

12. The semiconductor structure of claim 1, wherein a bottom-most surface of the via is below a top-most surface of the second conductive line.

13. A semiconductor structure, comprising:
a substrate;
a first dielectric layer over the substrate;
a plurality of lower level conductive lines in the first dielectric layer and extending along a first direction;
an etch stop layer over the first dielectric layer;
a second dielectric layer over the etch stop layer;
an upper level conductive line in an upper portion of the second dielectric layer and extending along a second direction, wherein the second direction is perpendicular to the first direction;
a via extending through a lower portion of the second dielectric layer and the etch stop layer and coupling the upper level conductive line to a target lower level conductive line of the plurality of lower level conductive lines, wherein a bottom-most surface of the via is below a top-most surface of the target lower level conductive line; and
a dielectric cap over a portion of each of neighboring lower level conductive lines of the plurality of lower level conductive lines on opposite sides of the target lower level conductive line, wherein each dielectric cap is adjacent to the via and is below the etch stop layer.

14. The semiconductor structure of claim 13, wherein a spacing between the target lower level conductive line and each of the neighboring lower level conductive lines of the plurality of lower level conductive lines is a minimum conductive line spacing allowed by design rules according to a manufacturing process.

15. A semiconductor structure, comprising:
a first conductive line and a second conductive line in a first dielectric layer, wherein the first conductive line and the second conductive line each extend along a first direction, and a thickness of the second conductive line is greater than a thickness of the first conductive line;
a third conductive line in a second dielectric layer overlying the first dielectric layer, wherein the third conductive line extends along a second direction different from the first direction and above at least the second conductive line; and
a via in the second dielectric layer and electrically connecting the second conductive line and the third conductive line, wherein a first portion of the via lands on a portion of the second conductive line, and a second portion of the via extends between the first conductive line and the second conductive line in the second direction.

16. The semiconductor structure of claim 15, further comprising a dielectric cap over the first conductive line, wherein a bottom surface of the dielectric cap is below a top surface of the first dielectric layer.

17. The semiconductor structure of claim 16, wherein a top surface of the dielectric cap is above a bottom surface of the via.

18. The semiconductor structure of claim 15, wherein the third conductive line is continuous with the via.

19. The semiconductor structure of claim 15, further comprising a substrate, and the first dielectric layer is closer to the substrate than the second dielectric layer.

20. The semiconductor structure of claim 15, wherein a bottom-most surface of the via is below a top-most surface of the second conductive line.

* * * * *